(12) United States Patent
Chang et al.

(10) Patent No.: US 6,521,547 B1
(45) Date of Patent: Feb. 18, 2003

(54) METHOD OF REPAIRING A LOW DIELECTRIC CONSTANT MATERIAL LAYER

(75) Inventors: Ting-Chang Chang, Hsin-Chu (TW); Po-Tsun Liu, Hsin-Chu (TW); Yi-Shien Mor, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/682,479

(22) Filed: Sep. 7, 2001

(51) Int. Cl.$^7$ .................. H01L 21/31; H01L 21/469
(52) U.S. Cl. ............................. 438/781; 438/706
(58) Field of Search ....................... 438/637, 680, 438/689, 706, 745, 780, 781, 789, 790

(56) References Cited

U.S. PATENT DOCUMENTS 6,162,838 A * 12/2000 Kohl ........................ 521/77
6,287,979 B1 * 9/2001 Zhou et al. ............... 438/723
6,287,990 B1 * 9/2001 Cheung et al. ........... 438/780

* cited by examiner

Primary Examiner—David Nelms
Assistant Examiner—David Nhu
(74) Attorney, Agent, or Firm—Winston Hsu

(57) ABSTRACT

A method of repairing a low dielectric constant (low k) material layer starts with coating a photoresist layer on the low k material layer on a semiconductor wafer. After transferring a pattern of the photoresist layer to the low k material layer, an oxygen plasma ashing process is performed to remove the photoresist layer. Finally, by contacting the low k material layer with a solution of alkyl silane comprising an alkyl group and halo substituent, Si—OH bonds formed in the low k layer during the oxygen plasma ashing process are removed so as to repair damage to the low k material layer caused by the oxygen plasma ashing process, and to enhance a surface of the low k material layer to a hydrophobic surface to prevent moisture adhering to the surface of the low k material layer.

16 Claims, 11 Drawing Sheets

METHOD OF REPAIRING A LOW DIELECTRIC CONSTANT MATERIAL LAYER

BACKGROUND OF INVENTION

1. Field of the Invention

The present invention relates to a method of repairing a low dielectric constant (low k) material layer, and more specifically, to a method of repairing damage to the low k material layer caused by an oxygen plasma ashing process by using a solution of alkyl silane comprising an alkyl group and a halo substituent to remove Si—OH bonds formed in the low k layer during the oxygen plasma ashing process.

2. Description of the Prior Art

With a decreasing size of semiconductor devices and an increase in integrated circuit (IC) density, RC time delay effects, produced between the metal wires, seriously affect IC operation and performance, and reduce IC operating speed. RC time delay effects are more obvious especially when the line width is reduced to 0.25 $\mu$m, or even 0.13 $\mu$m in a semiconductor process.

RC time delay effects produced between metal wires are a product of an electrical resistance (R) of the metal wires and a parasitic capacitance (C) of a dielectric layer between the metal wires. Normally RC time delay effects can be reduced by either using conductive materials with a lower resistance such as a metal wire, or reducing the parasitic capacitance of the dielectric layer between metal wires. In the approach of using a metal wire with a lower resistance, copper interconnect technology replaces the traditional Al:Cu(0.5%) alloy fabrication process and is a necessary tendency in multilevel metallization processes. Due to copper having a low resistance (1.67 $\mu\Omega$-cm) and higher current density load without electro-migration in the Al/Cu alloy, the parasitic capacitance between metal wires and connection levels of metal wires is reduced. However, reducing RC time delay produced between metal wires by only using copper interconnect technology is not enough. Also, some fabrication problems of copper interconnect technology need to be solved. Therefore, it is more and more important to reduce RC time delay by the approach of reducing the parasitic capacitance of the dielectric layer between metal wires.

Additionally, the parasitic capacitance of a dielectric layer is related to the dielectric constant of the dielectric layer. As the dielectric constant of the dielectric layer decreases, the parasitic capacitance of the dielectric layer decreases. Traditional silicon dioxide, having a dielectric constant of 3.9, cannot meet the requirement of 0.13 $\mu$m semiconductor processes, so some new low k materials, such as polyimide (PI), FLARE™, FPI, PAE-2, PAE-3 or LOSP are thereby consecutively proposed. However, these low k materials are composed of carbon, hydrogen and oxygen, and have significantly different properties than those of traditional silicon dioxide used in etching or adhering with other materials. Most of these low k materials have some disadvantages such as poor adhesion and poor thermal stability, so they cannot properly integrate into current IC fabrication processes.

Therefore, another kind of low k dielectric layer, such as hydrogen silsesquioxane (HSQ), methyl silsesquioxane (MSQ) and HOSP,having dielectric constants of 2.8, 2.7 and 2.5 respectively, which uses the silicon dioxide as a base, and adds some carbon and hydrogen elements, is needed. These silicon based low k materials have potential in the future since properties of these materials resemble traditional silicon dioxide and can be easily integrated into the current IC fabrication process.

Please refer to FIG. 1 to FIG. 3 of schematic views of removing a photoresist layer according the prior art. As shown in FIG. 1, a semiconductor wafer 10 comprises a silicon substrate 12 and a low k material layer 14, composed of $SiO_2$-based materials such as hydrogen silsesquioxane (HSQ), methyl silsesquioxane (MSQ) and HOSP,formed on the silicon substrate 12 by performing a chemical vapor deposition (CVD) process or a spin-on process.

As shown in FIG. 2, a photoresist layer 16 is coated on the low k material layer 14 and an opening 18 is formed in the photoresist layer 16 to expose portions of the low k material layer 14 thereafter. By performing a dry etching process to etch the low k material layer 14 through the opening 18, a pattern in the photoresist layer 16 is transferred to the low k material layer 14.

As shown in FIG. 3, a stripping process, comprising an ashing process and a dipping process, is performed. By performing the ashing process with an oxygen plasma supply, gaseous carbon dioxide and water vapor are formed by a reaction between the oxygen plasma and carbon and hydrogen atoms in the photoresist layer 16. The photoresist layer 16 is thus stripped. Finally, the semiconductor wafer 10 is dipped in the photoresist stripper to completely remove the photoresist layer 16.

However, when patterning a dielectric layer composed of $SiO_2$-based low k materials, such as HSQ, MSQ or HOSP, the dielectric layer suffers some damage during an etching or stripping process. Since a dry oxygen plasma ashing process and a wet stripper are frequently employed in the stripping process to remove a photoresist layer, bonds in a surface of the dielectric layer are easily broken by oxygen plasma bombardment and react with oxygen ions as well as with wet stripper to form Si—OH bonds. Since the Si—OH bonds absorb water moisture, having a dielectric constant of approximately 78, the dielectric constant and leakage current of the dielectric layer are consequently increased, and a poisoned via phenomenon occurs, thereby seriously affecting the reliability of products.

SUMMARY OF INVENTION

It is therefore a primary object of the present invention to provide a method of repairing a low dielectric constant (low k) material layer so as to prevent an increase in either dielectric constant or current leakage of the low k material layer.

According to the claimed invention, a method of repairing a low k material layer starts with providing a semiconductor wafer with a silicon oxide based ($SiO_2$-based) low k material layer. A hydrogen plasma pretreatment is performed on the low k material to reinforce the low k material layer. A photoresist layer is then coated on the low k material layer and an opening is formed in the photoresist layer to expose portions of the low k material layer thereafter. By dry etching the low k material layer through the opening, a pattern in the photoresist layer is transferred to the low k material layer. An oxygen plasma ashing process is then performed to remove the photoresist layer. Finally, by contacting the low k material layer with a solution of alkyl silane comprising an alkyl group and a halo substituent, Si—OH bonds formed in the low k layer during the oxygen plasma ashing process are removed. Damage to the low k material layer caused by the oxygen plasma ashing process is thus repaired. Simultaneously, a surface of the low k material layer is enhanced to a hydrophobic surface to prevent moisture adhering to the surface of the low k material layer.

It is an advantage of the present invention against the prior art that Si—OH bonds formed in the low k material layer 44 due to the plasma ashing process are eliminated by contacting the low k material layer with a solution of alkyl silane comprising an alkyl group and a halo substituent. Damage to the low k material layer caused by the plasma ashing process is thus repaired. In addition, the method provided in the present invention can further change the surface of the low k material layer from hydrophilic to hydrophobic. Therefore, the hydrophobic surface can prevent moisture absorption in the following process environment. Consequently, an increase in either the dielectric constant or current leakage of the low k material layer 44 is prevented as well.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
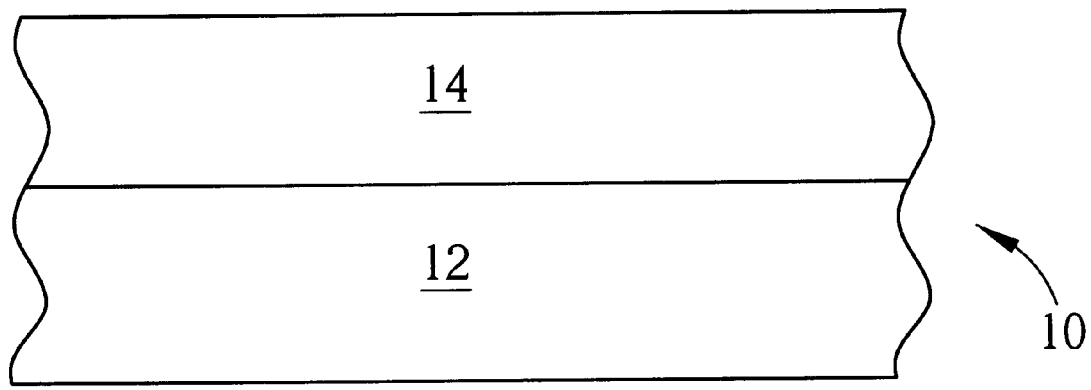
FIG. 1 to FIG. 3 are schematic views of removing a photoresist layer according the prior art.
Figure 2:
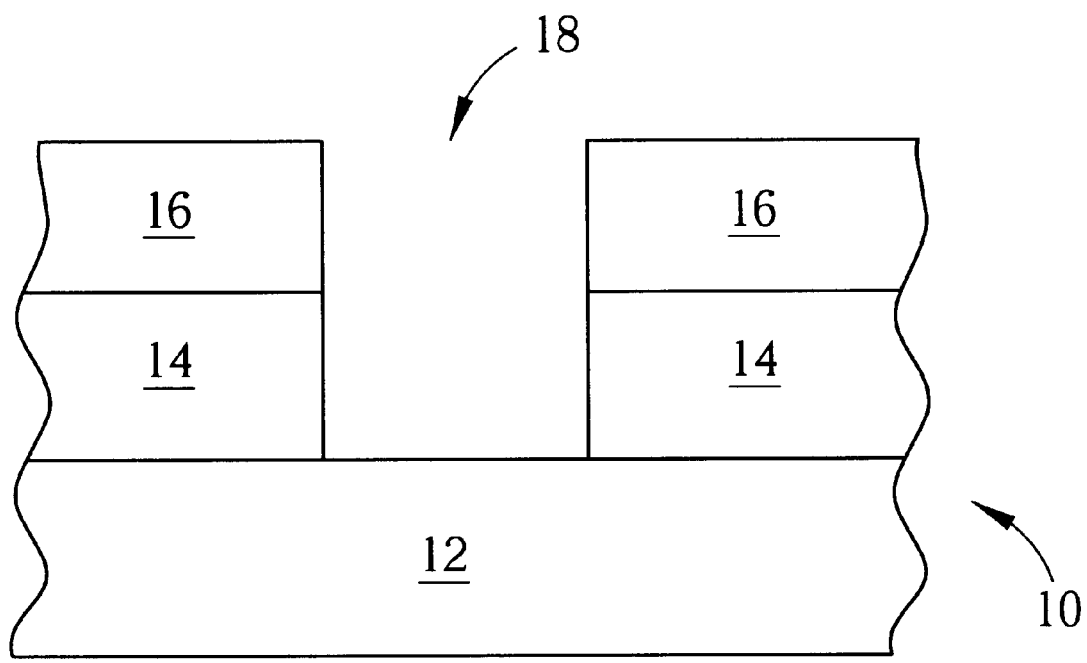
Figure 3:
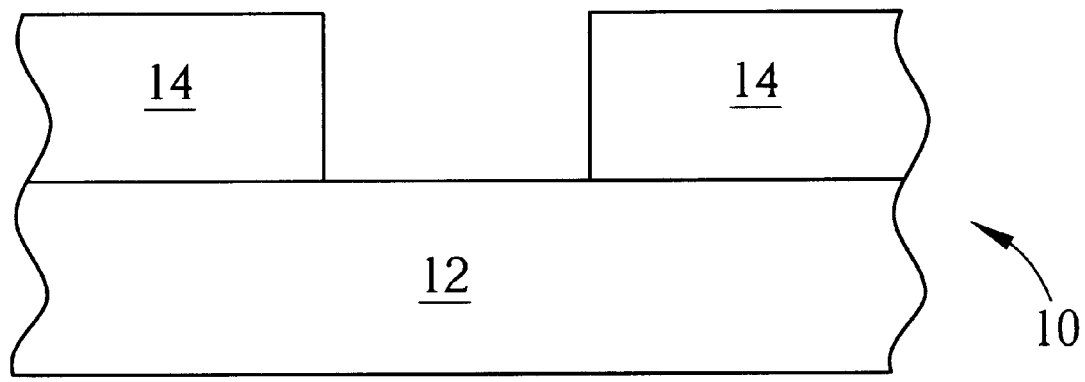
Figure 4:
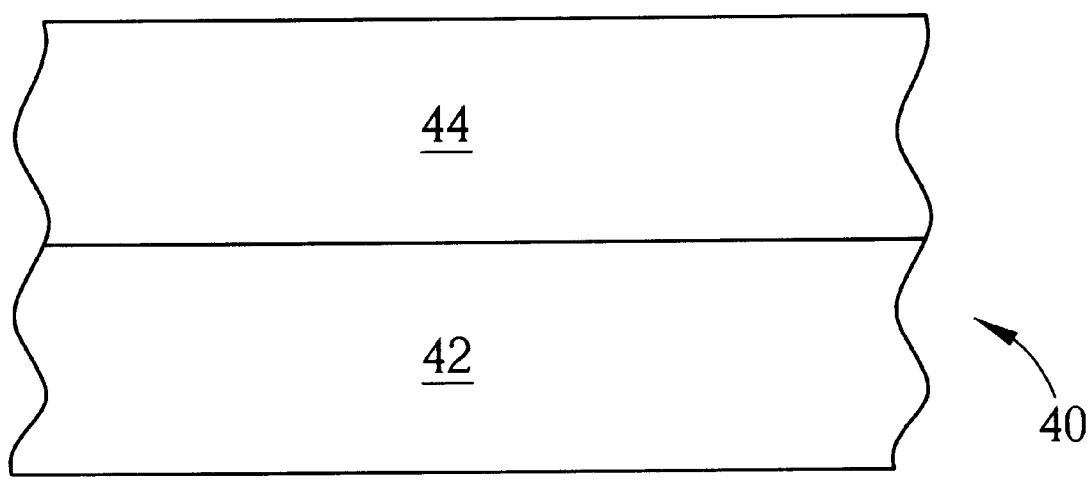
FIG. 4 to FIG. 7 are schematic views of repairing a low dielectric constant (low k) material layer according to the present invention.

Please refer to FIG. 4 to FIG. 7 of schematic views of repairing a low dielectric constant (low k) material layer according to the present invention. As shown in FIG. 4, a semiconductor wafer 40 comprises a silicon substrate 42 and a low k material layer 44, composed of $SiO_2$-based materials, such as hydrogen silsesquioxane (HSQ), methyl silsesquioxane (MSQ), HOSP and porous sol-gel, formed on the silicon substrate 42 by performing a chemical vapor deposition (CVD) process or a spin-on process.

Figure 5:
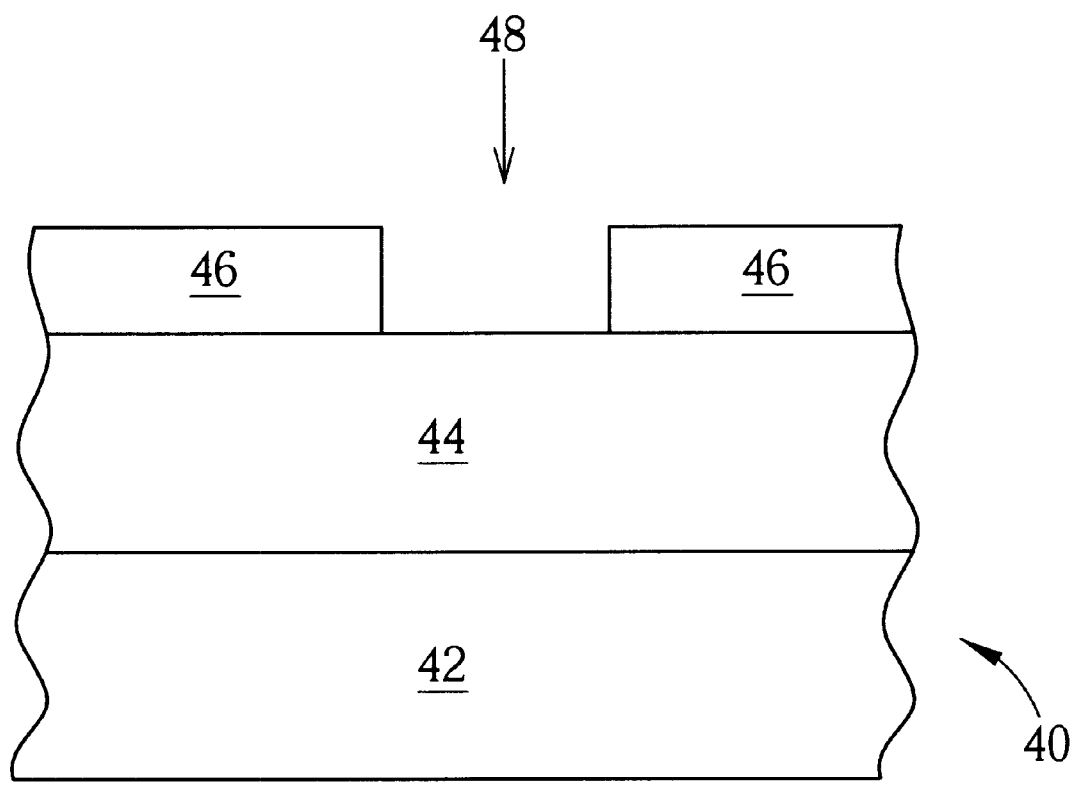
Figure 6:
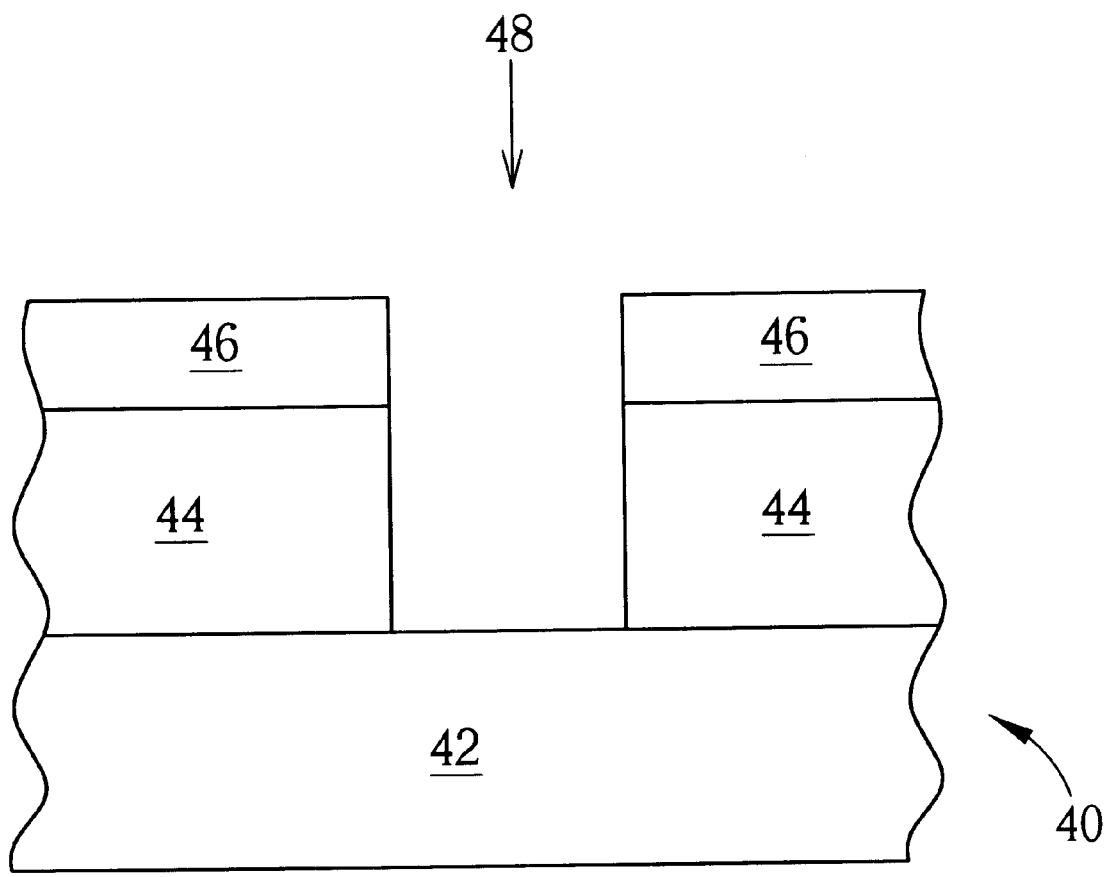

As shown in FIG. 5, a hydrogen-containing plasma treatment, with hydrogen plasma formed at a temperature ranging from 200 to 350° C. and in a pressure ranging from 200 to 350 mTorr using hydrogen, having a flow rate ranging from 200 to 350 standard cubic centimeters per minute (sccm), with a radio frequency power (RF power) ranging from 90 to 150 Watts, is then performed on the low k material layer 44 to reinforce the low k material layer 44. A photoresist layer 46 is then coated on the low k material layer 44, and an opening 48 is formed in the photoresist layer 46 to expose portions of the low k material layer 44. As shown in FIG. 6, by dry etching the low k material layer 44 through the opening 48, a pattern in the photoresist layer 46 is transferred to the low k material layer 44.

Figure 7:
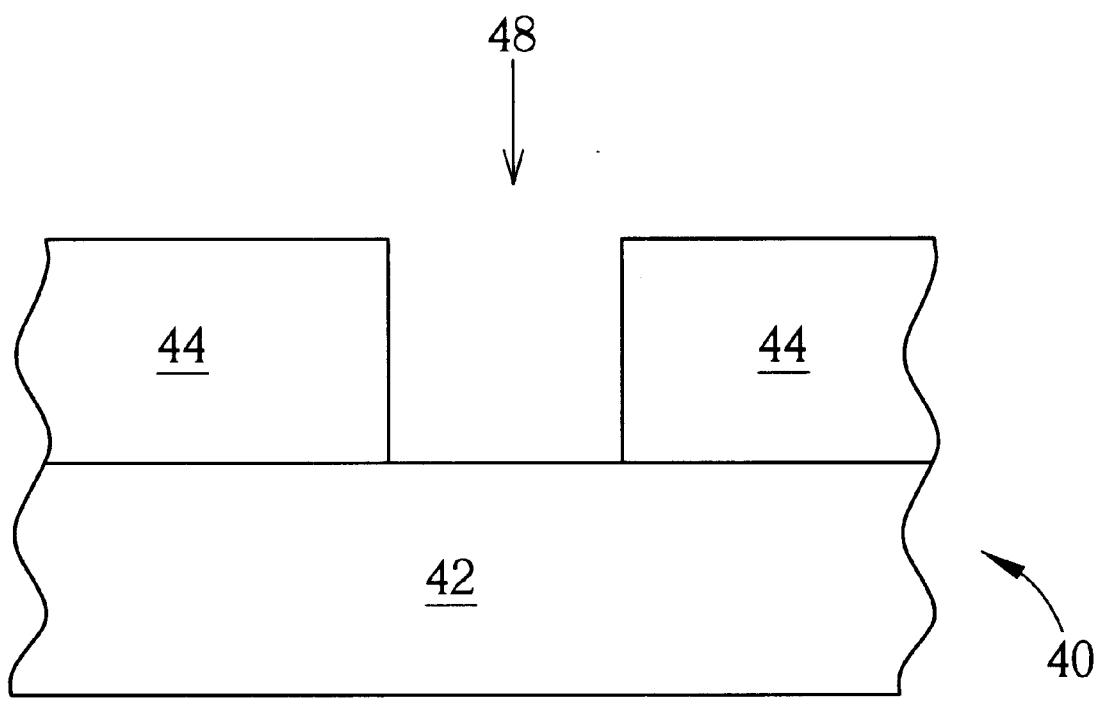

As shown in FIG. 7, a stripping process, comprising a plasma ashing process and a dipping process, is then performed. By performing the ashing process with an oxygen plasma supply, gaseous carbon dioxide and water vapor are formed by a reaction between the oxygen plasma and carbon and hydrogen atoms in the photoresist layer 46. The semiconductor wafer 40 is then dipped in the photoresist stripper to completely remove the photoresist layer 46. Since a surface of the low k material layer 44 is damaged by oxygen plasma and wet stripper during the stripping process, moisture-absorbing Si—OH bonds are formed in the low k material layer 44, so that both the dielectric constant and current leakage of the low k material layer 44 are increased.

Figure 8:
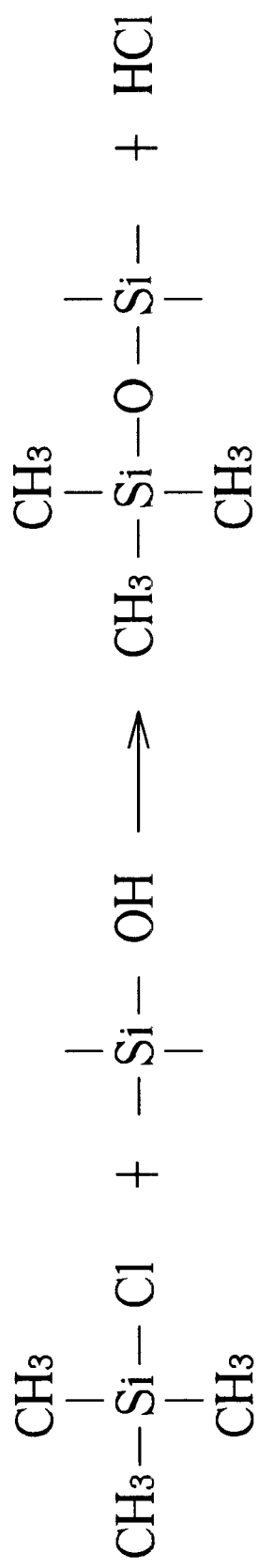
FIG. 8 is a chemical equation of a reaction between a TMCS and Si—OH bonds of the low k material layer.

A surface treatment is then performed on the low k material layer 44 by immersing the semiconductor wafer 40 in a solution of alkyl silane comprising an alkyl group and a halo substituent, or placing the semiconductor wafer 40 in an environment with the alkyl silane comprising the alkyl group and the halo substituent. The solution of alkyl silane comprising the alkyl group and the halo substituent is normally a hexane solution with trimethylchlorosilane (TMCS) of a volumetric concentration that is less than 8%. Therefore, the TMCS reacts with Si—OH bonds in the surface of the low k material layer 44 to eliminate the Si—OH bonds caused by the plasma ashing process. Please refer to FIG. 8 of the chemical equation of the reaction between the TMCS and the Si—OH bonds of the low k material layer 44. As shown in FIG. 8, Si—OH bonds react with TMCS to form Si—OSi(CH$_3$)$_3$. Therefore, not only are the Si—OH bonds in the low k material layer 44 eliminated to repair the low k material layer 44 damaged during the stripping process, but the surface of the low k material layer 44 is also changed from hydrophilic to hydrophobic. Consequently, the hydrophobic surface can prevent moisture absorption in the following process environment. Finally, a hot baking process is performed for 30 minutes at a temperature of 400° C. to remove the TMCS remaining on the low k material layer 44 at the end of the method.

Figure 9:
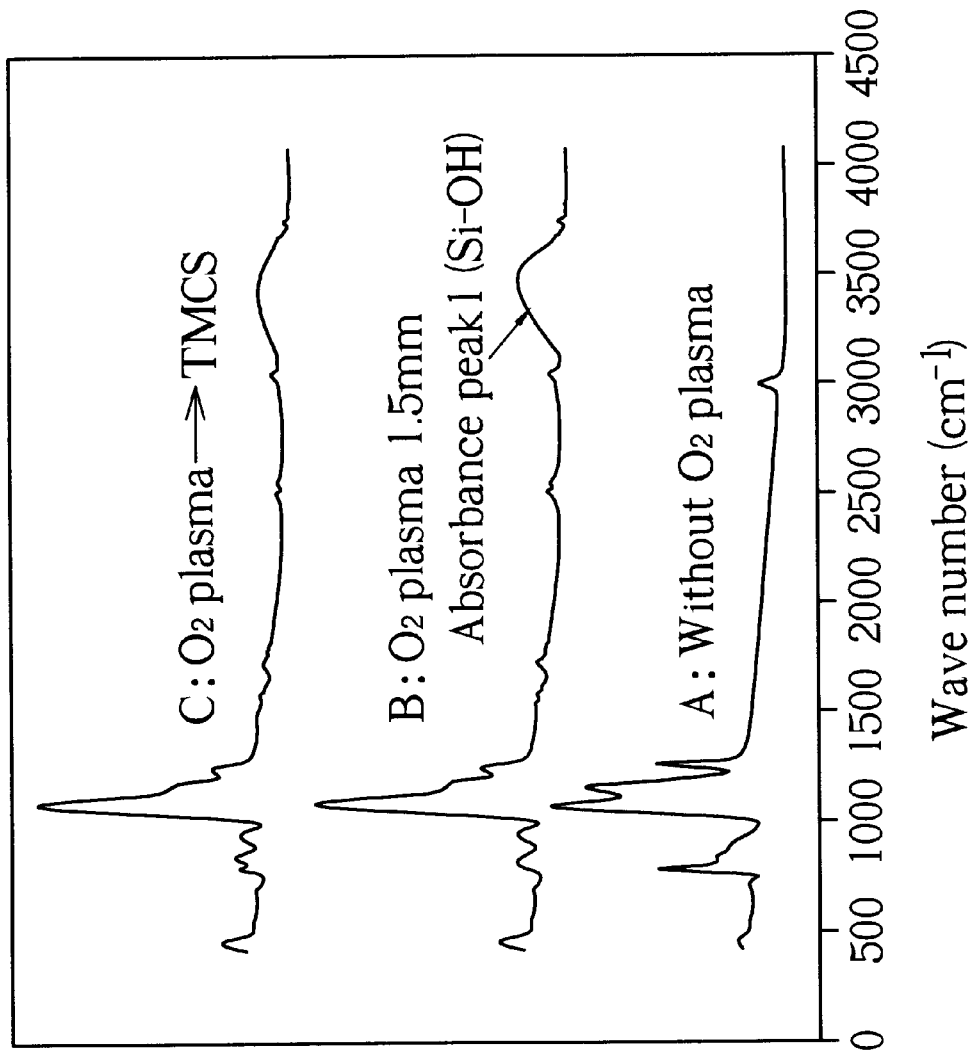
FIG. 9 is an infrared spectroscopy of a porous sol-gel dielectric layer according to the present invention.

Please refer to FIG. 9 of an infrared spectroscopy of the porous sol-gel dielectric layer according to the present invention. As shown in FIG. 9, curves A and B respectively represent infrared spectroscopy of the porous sol-gel dielectric layer before and after the plasma ashing process. Curve C represents an infrared spectroscopy of the porous sol-gel dielectric layer after performing both the plasma ashing process and the TMCS surface treatment. Wherein, the absorption peak 1 represents the absorption of Si—OH bonds, which absorb infrared waves of wave number ranging from 3000–3500 cm−1. As shown in FIG. 9, the porous sol-gel dielectric layer obviously forms the peak 1 of Si—OH bonds after the plasma ashing process. After TMCS surface treatment, the absorption of Si—OH bonds in the porous sol-gel dielectric layer is reduced.

Figure 10:
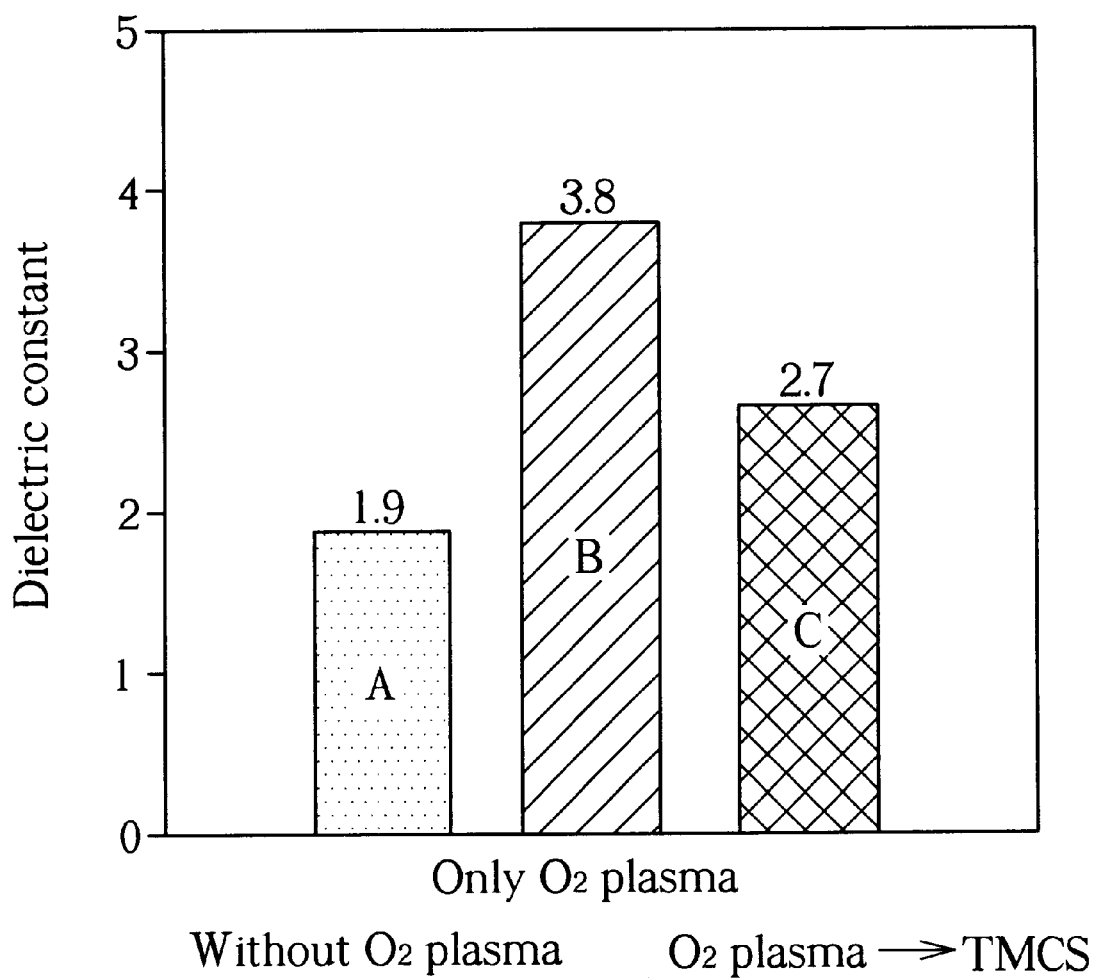
FIG. 10 is a bar chart of a dielectric constant of the porous sol-gel dielectric layer according to the present invention.

Please refer to FIG. 10 of a bar chart of the dielectric constant of the porous sol-gel dielectric layer according to the present invention. As shown in FIG. 10, dot square A and diagonal square B respectively represent the dielectric constant of the porous sol-gel dielectric layer before and after the plasma ashing process. Latticed square C represents the dielectric constant of the porous sol-gel dielectric layer after performing both the plasma ashing process and the TMCS surface treatment. As shown in FIG. 10, the dielectric constant of the porous sol-gel dielectric layer is increased from 1.9 to 3.8 after the plasma ashing process. After performing the TMCS surface treatment, the dielectric constant is reduced to 2.7. It shows that TMCS can repair the damaged structure of the porous sol-gel dielectric layer and reduce the increased dielectric constant caused by the plasma ashing process.

Figure 11:
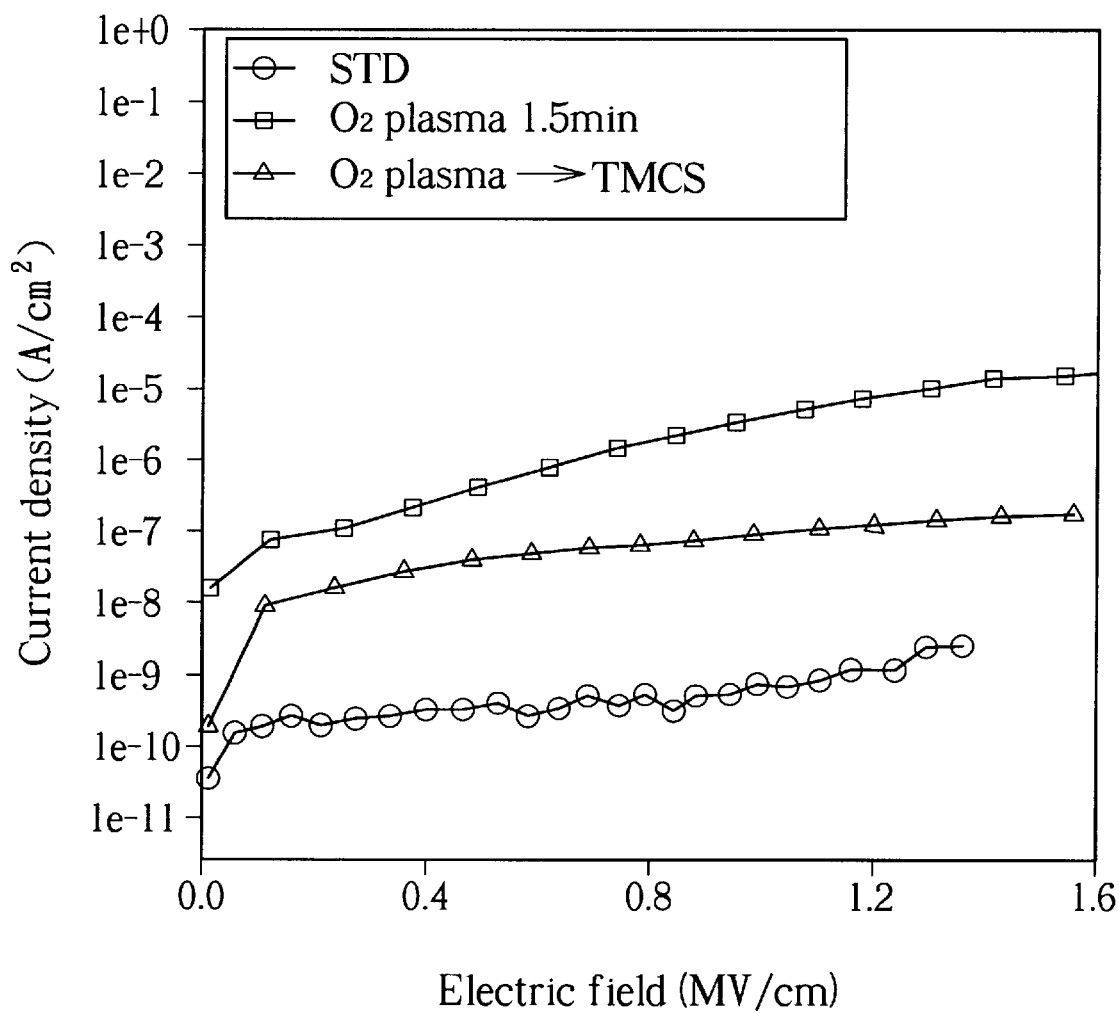
FIG. 11 is a chart showing a relationship between electrical field and current leakage density of the porous sol-gel dielectric layer according to the present invention.

Please refer to FIG. 11 of a chart showing a relationship between electrical field and current leakage density of the porous sol-gel dielectric layer according to the present invention. As shown in FIG. 11, circle signs and square signs respectively represent the relationship of the electric field and the current leakage density in the porous sol-gel dielectric layer before and after the plasma ashing process. Triangle signs represent the relationship of the electric field and the current leakage density in the porous sol-gel dielectric layer after performing both the plasma ashing process and the TMCS surface treatment. As shown in FIG. 11, the current leakage density of the porous sol-gel dielectric layer before performing the plasma ashing process is at about $10^{-10}$ to $10^{-9}$ A/cm$^2$. However, after performing the plasma ashing process, the current leakage density of the porous sol-gel dielectric layer is increased by a factor of 1,000 or 10,000. After further performing the TMCS treatment, the current leakage density of the porous sol-gel dielectric layer is decrease by a factor of 10 or 100. It shows that TMCS can repair the damaged structure of the dielectric layer caused by the plasma ashing process and reduce the increased current leakage caused by the plasma ashing process.

In comparison with the prior art, the semiconductor wafer 40 is immersed in the hexane solution with TMCS to eliminate Si—OH bonds formed in the low k material layer 44 due to the plasma ashing process. Damage to the low k material layer 44 caused by the plasma ashing process is thus repaired. In addition, the hexane solution with TMCS can further change the surface of the low k material layer 44 from hydrophilic to hydrophobic. Therefore, the hydrophobic surface can prevent moisture absorption in the following process environment. Consequently, an increase in either the dielectric constant or current leakage of the low k material layer 44 is prevented as well.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of repairing a low dielectric constant (low k) material layer, the method comprising:

providing a semiconductor wafer with a low k material layer;

coating a photoresist layer on the low k material layer;

forming an opening to expose a portion of the low k material layer;

dry etching the low k material layer through the opening to transfer a pattern in the photoresist layer to the low k material layer;

performing an oxygen plasma ashing process to remove the photoresist layer; and contacting the low k material layer with a hexane solution of alkyl silane comprising an alkyl group and halo substituent;

wherein the hexane solution of alkyl silane comprising the alkyl group and halo substituent is employed to remove Si—OH bonds formed in the low k layer during the oxygen plasma ashing process to repair damage to the low k material layer caused by the oxygen plasma ashing process, and to enhance a surface of the low k material layer to a hydrophobic surface to prevent moisture adhering to the surface of the low k material layer.

2. The method of claim 1 wherein the low k material layer is a silicon oxide based (SiO$_2$-based) low k material layer.

3. The method of claim 1 wherein the low k material layer comprises hydrogen silsesquioxane (HSQ), methyl silsesquioxane (MSQ), hybrid-organic-siloxane-polymer (HOSP), or sol-gel.

4. The method of claim 1 wherein a hydrogen plasma pretreatment is performed on the low k material layer before coating the photoresist layer on the low k material layer.

5. The method of claim 1 wherein the alkyl silane comprising the alkyl group and halo substituent is an alkyl silane comprising a mono-halo substituent.

6. The method of claim 5 wherein the alkyl silane comprising the alkyl group and halo substituent is composed of trimethylchlorosilane (Si(CH$_3$)$_3$Cl), dimethylchlorosilane (Si(CH$_3$)$_2$HCl), ethylchlorosilane (Si(C$_2$H$_5$)H$_2$Cl), propylchlorosilane (Si(C$_3$H$_7$)H$_2$Cl), ethylbromosilane (Si(C$_2$H$_5$)H$_2$Br), or propylbromosilane (Si(C$_3$H$_7$)H$_2$Br).

7. The method of claim 1 wherein the hexane solution of alkyl silane comprising the alkyl group and halo substituent is a hexane solution with trimethylchlorosilane (TMCS) of a volumetric concentration that is less than 8%.

8. A method of repairing a low dielectric constant (low k) material layer, the method comprising:

providing a semiconductor wafer with a low k material layer;

coating a photoresist layer on the low k material layer;

forming an opening to expose a portion of the low k material layer;

dry etching the low k material layer through the opening to transfer a pattern in the photoresist layer to the low k material layer;

performing a photoresist ashing process to remove the photoresist layer; and performing at least one surface repairing process to contact the low k material layer with a hexane solution of alkyl silane comprising an alkyl group and halo substituent;

wherein the hexane solution of alkyl silane comprising the alkyl group and halo substituent is employed to remove Si—OH bonds formed in the low k layer during the photoresist ashing process, to repair the damage of the low k material layer caused by the photoresist ashing process, and to enhance a surface of the low k material layer to a hydrophobic surface.

9. The method of claim 8 wherein the low k material layer comprises hydrogen silsesquioxane (HSQ), methyl silsesquioxane (MSQ), hybrid-organic-siloxane-polymer (HOSP), or sol-gel.

10. The method of claim 8 wherein the photoresist ashing process is performed with an oxygen plasma supply.

11. The method of claim 8 wherein the photoresist ashing process is performed with an ozone plasma supply.

12. The method of claim 8 wherein a hydrogen plasma pretreatment is performed on the low k material layer before coating the photoresist layer on the low k material layer.

13. The method of claim 8 wherein the hexane solution of alkyl silane comprising the alkyl group and halo substituent is a hexane solution with trimethylchlorosilane (TMCS) of a volumetric concentration that is less than 8%.

14. The method of claim 8 wherein the alkyl silane comprising the alkyl group and halo substituent is a liquid phase alkyl silane comprising the alkyl group and halo substituent.

15. The method of claim 8 wherein the alkyl silane comprising the alkyl group and halo substituent is an alkyl silane comprising a mono-halo substituent.

16. The method of claim 15 wherein the alkyl silane comprising the alkyl group and halo substituent is composed of trimethylchlorosilane (Si(CH$_3$)$_3$Cl), dimethylchlorosilane (Si(CH$_3$)$_2$HCl), ethylchlorosilane (Si(C$_2$H$_5$)H$_2$Cl), propylchlorosilane (Si(C$_3$H$_7$)H$_2$Cl), ethylbromosilane (Si(C$_2$H$_5$)H$_2$Br) or propylbromosilane (Si(C$_3$H$_7$)H$_2$Br).

* * * * *